United States Patent
Sari

(10) Patent No.: US 11,052,653 B2
(45) Date of Patent: Jul. 6, 2021

(54) SYSTEM AND METHOD FOR IN-LINE PROCESSING OF WATER WASHABLE FLEXO PHOTOPOLYMER PRINTING PLATES

(71) Applicant: MEGA ELEKTROMEKANIK MAKINA IMALAT ITHALAT IHRACAT SANAYI VE TICARET LIMITED SIRKETI, Istanbul (TR)

(72) Inventor: Erhan Sari, Istanbul (TR)

(73) Assignee: MEGA ELEKTROMEKANIK MAKiNA IMALAT ITHALAT IHRACAT SANAYI VE TICARET LIMITED SIRKETI, Istanbul (TR)

( * ) Notice: Subject to any disclaimer, the term of this patent is extended or adjusted under 35 U.S.C. 154(b) by 0 days.

(21) Appl. No.: 16/643,856

(22) PCT Filed: Sep. 11, 2017

(86) PCT No.: PCT/TR2017/050426
§ 371 (c)(1),
(2) Date: Mar. 3, 2020

(87) PCT Pub. No.: WO2019/050490
PCT Pub. Date: Mar. 14, 2019

(65) Prior Publication Data
US 2021/0060926 A1    Mar. 4, 2021

(51) Int. Cl.
*B41F 35/00* (2006.01)
*B08B 1/00* (2006.01)
*B08B 1/02* (2006.01)

(52) U.S. Cl.
CPC .......... *B41F 35/001* (2013.01); *B08B 1/002* (2013.01); *B08B 1/02* (2013.01); *B41P 2235/23* (2013.01)

(58) Field of Classification Search
None
See application file for complete search history.

(56) References Cited

U.S. PATENT DOCUMENTS

2018/0004092 A1* 1/2018 Swihart ................ G03F 7/3057

FOREIGN PATENT DOCUMENTS

| CA | 2958912 A1 | 3/2016 |
|----|-----------|--------|
| DE | 4231103 A1 | 3/1994 |

(Continued)

*Primary Examiner* — Mikhail Kornakov
*Assistant Examiner* — Ryan L Coleman
(74) *Attorney, Agent, or Firm* — Bayramoglu Law Offices LLC

(57) ABSTRACT

A system for processing water washable flexo photopolymer printing plates, the system comprises a washing line including one or more brushes and a surface essentially facing said brushes, and a guiding means adapted to guide a water washable photopolymer printing plate through the washing line by pulling it from a vicinity of a downstream edge thereof and automatically dragging such water washable photopolymer printing plate on said surface. Said brushes are adapted to contact onto a side of such water washable photopolymer printing plate in a washing direction from the downstream edge towards an upstream edge thereof. The system further comprises one or more attachments adapted to be annexed to the vicinity of the upstream edge of a water washable photopolymer printing plate, the attachments being further adapted to exert friction onto the surface, said friction being greater than that between such water washable photopolymer printing plate and said surface.

7 Claims, 3 Drawing Sheets

(56) References Cited

FOREIGN PATENT DOCUMENTS

| EP | 0225678 | A1 | 6/1987 |
| EP | 1993850 | A2 | 11/2008 |
| EP | 2440410 | A2 | 4/2012 |

* cited by examiner

SYSTEM AND METHOD FOR IN-LINE PROCESSING OF WATER WASHABLE FLEXO PHOTOPOLYMER PRINTING PLATES

CROSS REFERENCES TO THE RELATED APPLICATIONS

This application is the national phase entry of International Application No. PCT/TR2017/050426, filed on Sep. 11, 2017, the entire contents of which are incorporated herein by reference.

TECHNICAL FIELD

The present invention relates to a system and method for processing water washable flexo photopolymer printing plates. In particular, the present invention relates to a system and method for washing water washable flexo photopolymer printing plates with increased reliability.

BACKGROUND

Non-polar solvents decrease friction between solvent-washable photopolymer printing plates and brushes used in washing and in-line processing of such plates, because such solvents provide lubrication to the surfaces contacting each other in corresponding washing lines. Therefore solvent-washable photopolymer printing plates can be easily passed through automatically guided washing lines with brushes, without being deformed or wrinkled due to friction.

Yet, water washable flexo photopolymer printing plates are not suitable to be processed in a washing step similar to that used in processing of solvent washable photopolymer printing plates, since relatively high friction in aqueous washing medium causes deformations or wrinkling of the water washable flexo photopolymer printing plates when contacted with brushes in such washing line. The deformation or wrinkling of water washable flexo photopolymer printing plates in case where the washing process is performed in a system (100') having a washing line (10') with one or more brush(es) (11) a guiding means (13) and a surface (12) on which the plate (90) is to be dragged and guided is roughly visualized in FIG. 1.

Known alternative systems and methods used in processing of water washable flexo photopolymer printing plates without deforming or wrinkling them, can be exemplified as washing in a tank, and using a fixed holder. Both of said methods have at least the following common drawbacks:
  they include releasably fixing of the printing plate onto an adhesive surface, which requires the difficult tasks of adhering a complete side of the printing plate onto the adhesive plate without allowing any air bubble, and releasing the printing plate by pulling that from the adhesive plate at the end of the process, which get even more difficult with larger sizes of the printing plates; air bubbles cause uneven processing of the plate surface,
  they do not allow processing of a plurality of printing plates automatically in a row; until the completion of processing of a plate it is not possible to start processing a further plate;
  energy and processing materials consumption cannot be altered in accordance with the size of the printing plate to be processed; such systems have a fixed size adapted to process a plate having a maximum size processable in those, and materials and energy consumption of said systems cannot be altered (i.e. decreased) in accordance with smaller sizes of plates to be processed.

Other alternative systems and methods for the same task include: attaching the printing plate onto a heavy and sizable carrier which is to be passed through a washing line, or carrying the printing plate on a mandrel.

Such carriers dramatically increase the requirement of labor force especially in the case where the desired production capacity is high. When mandrels are used, it is not possible to keep the mandrels clean throughout the washing process and this results in contaminations on the printing plate after the washing process.

Hence, it is desirable to improve the systems and methods for processing water washable flexo photopolymer printing plates, considering the abovementioned shortcomings.

Primary object of the present invention is to overcome the abovementioned shortcomings encountered in the prior art.

Another object of the present invention is to provide a system and method for in-line direct processing a water washable photopolymer printing plate without deforming or wrinkling the same.

SUMMARY

The present invention proposes a system for processing water washable flexo photopolymer printing plates, the system comprising a washing line including one or more brushes and a surface essentially facing said brushes, and a guiding means adapted to guide a water washable photopolymer printing plate through the washing line by pulling it from a vicinity of a downstream edge thereof and automatically dragging it on said surface whereby said brushes are adapted to contact onto a side of such water washable photopolymer printing plate in a direction from the downstream edge towards an upstream edge of such water washable photopolymer printing plate, wherein the system further comprises one or more attachments adapted to be annexed to the vicinity of the upstream edge of a water washable photopolymer printing plate, the attachments being further adapted to exert friction onto the surface, said friction being greater than that between such water washable photopolymer printing plate and said surface of the system, so that stretching of such water washable photopolymer printing plate can be achieved over friction between said attachment(s) and said surface upon such water washable photopolymer printing plate being dragged by the guiding means.

The present invention further proposes a method of processing water washable flexo photopolymer printing plates including stretching thereof between guiding means and attachments using extended friction obtained thereby.

BRIEF DESCRIPTION OF THE DRAWINGS

The accompanying drawings are given solely for the purpose of exemplifying the invention whose advantages over prior art were outlined above and will be explained in detail hereinafter.

Figure 1:
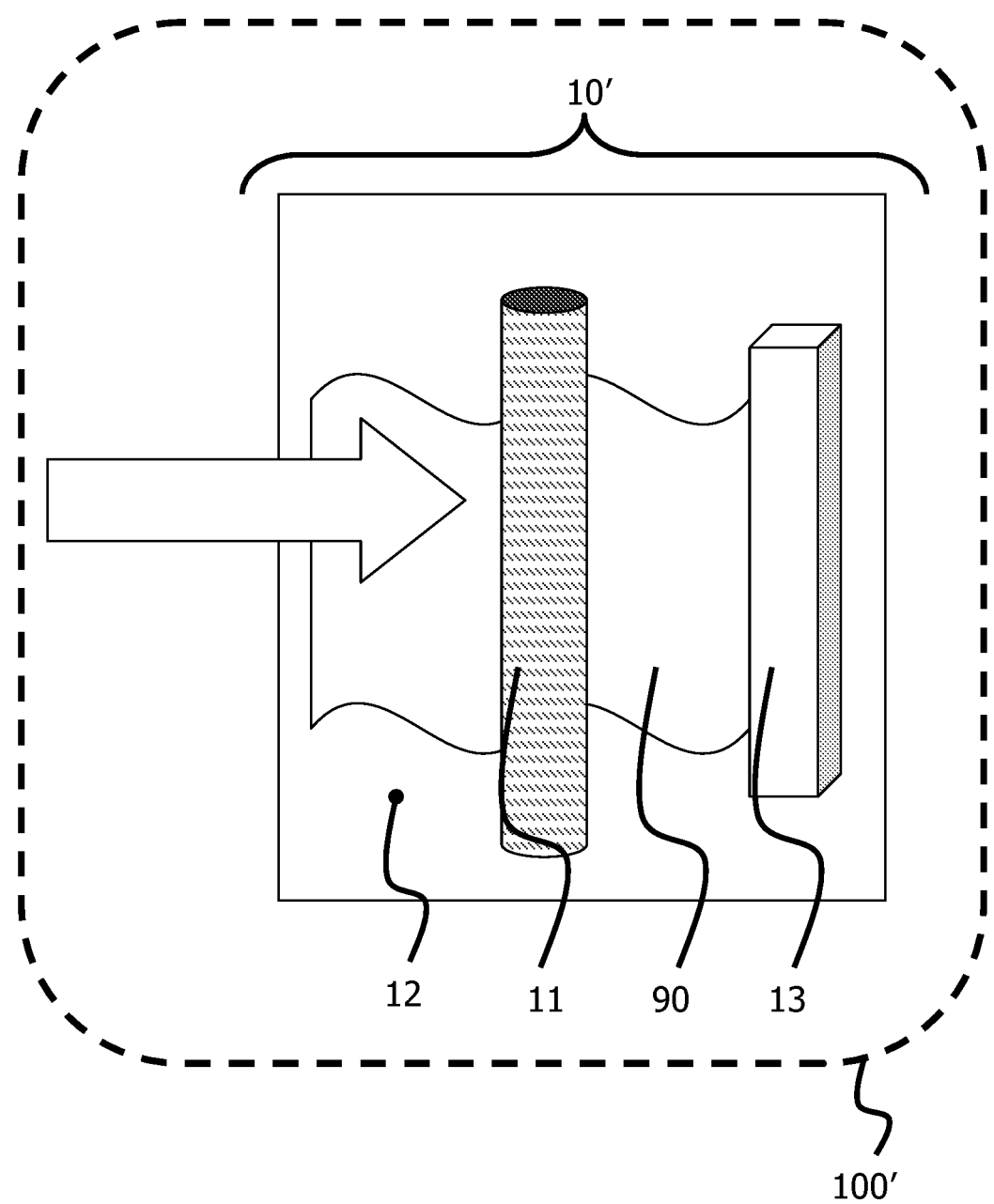
FIG. 1 shows a schematic top view of a theoretical prior art system for in-line direct processing of water washable flexo photopolymer printing plates.

LIST OF REFERENCE SIGNS 10 washing line
10' prior art washing line
11 brush
12 surface
13 guiding means
20 attachment
21 magnet
22 further holding means
23 pin
24 hole
30 photopolymer printing plate
91 downstream edge
92 upstream edge
100 system
100' prior art system
GD guiding direction
WD washing direction
A pin-and-hole axis

DETAILED DESCRIPTION OF THE EMBODIMENTS

Figure 2:
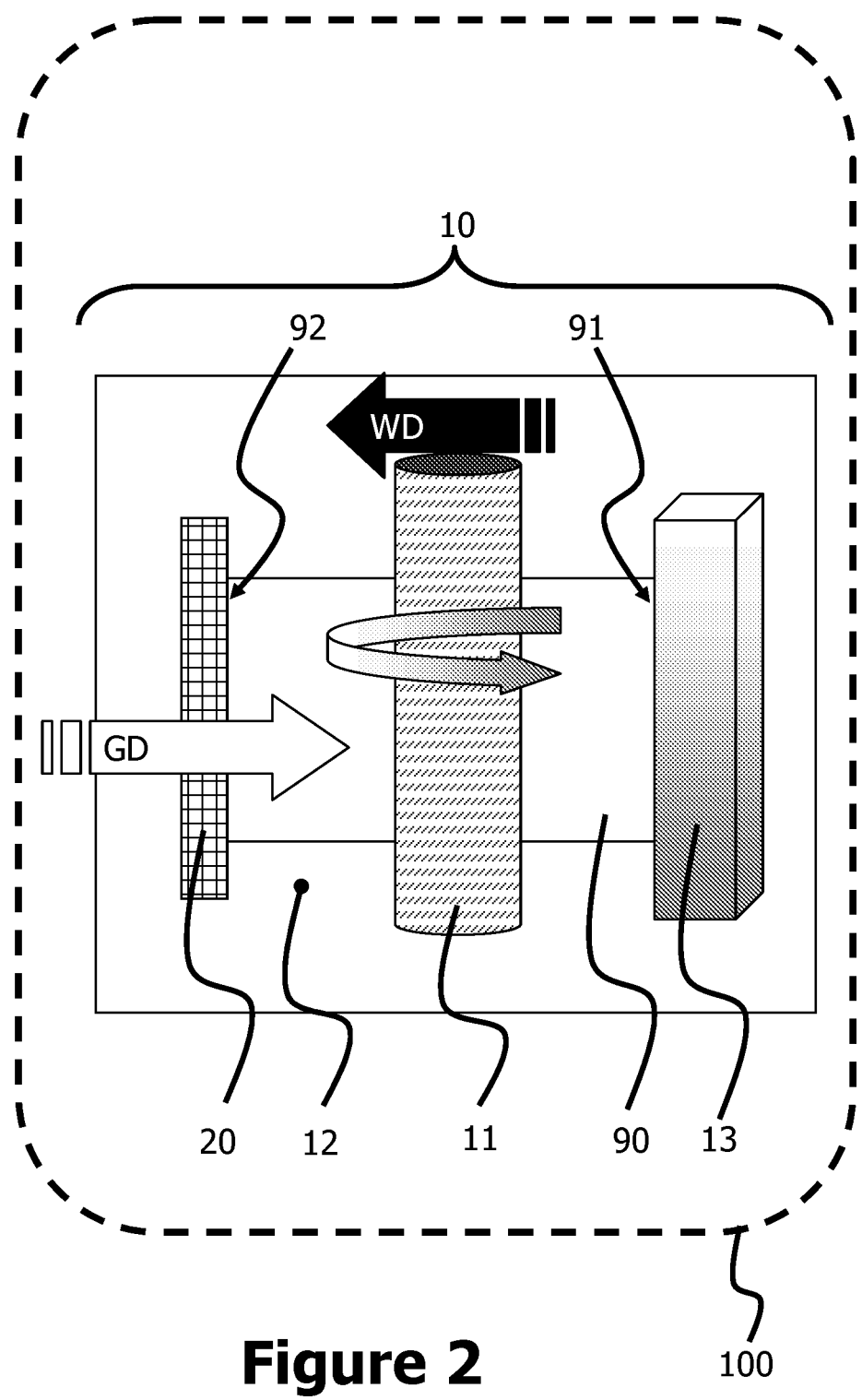
FIG. 2 schematizes top view of a water washable flexo photopolymer printing plates in-line direct processing system according to the present invention.

Referring to the figures summarized above, the present invention proposes a system for processing water washable flexo photopolymer printing plates. The system (100) comprises a washing line (10) including one or more brushes (11) and a surface (12) essentially facing said brushes (11) when in use. The system further comprises a guiding means (13) adapted to guide a water washable photopolymer printing plate (90) (e.g. a water washable photopolymer printing plate, which can also be named or abbreviated as: flexo plate, plate or WFP) through said washing line (10) by pulling such plate (90) from a vicinity of a downstream edge (91) thereof. The guiding means (13) is further adapted to drag such plate (90) on said surface (12). The system is adapted to provide contact between said brushes (11) with a side of such plate (90) essentially in a washing direction (WD) from the downstream edge (91) towards an upstream edge (92) of the plate. Thus the guiding means is adapted to guide a water washable flexo photopolymer printing plate (90) relative to the brushes (11) in a guiding direction (GD) as schematically shown in the FIG. 2.

The system according to the present invention further comprises one or more attachment(s) (20) adapted to be annexed to the vicinity of the upstream edge (92) of a water washable photopolymer printing plate (90). The attachments (20) are further adapted to exert friction (e.g. an extended friction) onto the surface (12), so that said friction is greater than that between the plate (90) and said surface under processing conditions.

The term "processing conditions" here corresponds to washing conditions where a water washable photopolymer printing plate (90) is washed in an aqueous medium.

With the present invention, stretching of such plate (90) can be achieved over said friction between the attachment (20) and the surface (12) upon dragging such water washable flexo photopolymer printing plates (90) by the guiding means (13).

In an embodiment according to the present invention, the attachments (20) comprise one or more magnets (21) (as exemplified in the FIG. 3), and said surface (12) comprises ferromagnetic material. Alternatively, the attachments (20) comprise ferromagnetic material and said surface (12) comprise one or more magnets (21). This feature enables that the friction between the attachment (20) and the surface (12) is extended or essentially achieved over magnetic attraction between said ferromagnetic material and the magnets. Use of magnets and ferromagnetic material to be attracted thereby, enables reliable long term repeatable use of the system; since magnets and ferromagnetic materials have long service life and they can be easily selected to be mechanically suitable to pass through the line for numerous times without wearing out.

In another embodiment according to the present invention, the attachments (20) comprise one or more sucking disc(s) (not shown) adapted to provide decreased pressure when applied on said surface (12), e.g. upon being pushed thereonto. This feature enables that the friction between the attachment and the surface is, in use, extended or essentially achieved over decreased gas pressure between the sucking discs and said surface.

In another embodiment according to the present invention, the attachments (20) comprise an adhesive (not shown) so that the attachments (20) reversibly adhere to the surface (12) when brought into contact therewith. With this embodiment the attachments are enabled to provide a reversible adhesion onto the surface, thus in use, the friction between the attachments and the surface is extended or essentially achieved over said reversible adhesion.

In another embodiment according to the present invention, the attachments (20) comprise one or more weights (not shown). Said weights have a density which is greater than that of a water washable photopolymer printing plate (90). Selecting materials according to their densities is within the capabilities of any person skilled in the art of materials science, e.g. by looking up to any table listing densities of materials which do not dissolve or swell in water. This feature enables that, in use, the friction between the attachment and said surface is extended or essentially achieved over gravity force applied onto said weights dragging on said surface.

Two or more of the above explained features including 'magnet and ferromagnetic material pair(s)', sucking disc (s), adhesive and/or weight can also be combined for potentiating the extension of the friction between the surface and the attachment.

In the system according to the present invention, the attachment (20) can be adapted to be affixed to such water washable photopolymer printing plate through various ways available for a person skilled in machines design; e.g. through a plurality of pin-and-hole connection. Alternatively, the attachment can be adapted to be affixed to such water washable photopolymer printing plate through adhesion or through one or more clamps.

A further holding means (22) can be also included, which is adapted to cooperate with the attachment (20) by sandwiching the water washable photopolymer printing plate. This provides a still releasable but stronger fixing of the attachment (12) to the plate (90). An example of a holding means (22) is depicted in the FIG. 3 as having pin-and-hole connection with the attachment (20) as it has with the plate (90) here. In this example, the holding means (22) shares two or more of the pin-and-hole axes with the attachment (20) and the plate (90), so that coupling between the attachment (20) and the holding means (22) can be achieved over the readily available axes (A) of pins (23) and holes (24) without necessitating any further coupling means therebetween.

The present invention further proposes a method for processing water washable flexo photopolymer printing plates (90) in a washing line (10) comprising one or more brushes (11) and a surface (12) essentially facing said brushes (11), and a guiding means (13) adapted to guide the water washable photopolymer printing plate (90) through the washing line (10) by pulling it from a vicinity of a downstream edge (91) thereof and dragging it on said surface (12), whereby a side of the water washable photopolymer printing plate (90) is brought into contact with said brushes (11) in a washing direction (WD) from the downstream edge (91) towards an upstream edge (92) of the water washable photopolymer printing plate (90).

In the method according to the present invention, the vicinity of the downstream edge (91) of the water washable photopolymer printing plate (90) is annexed with one or more attachments (20) providing friction between said attachments (20) and said surface (12). Said friction is greater than that between the water washable photopolymer printing plate (90) and said surface (12) on which the plate (90) is dragged/guided under process conditions (i.e. aqueous washing conditions). This set of features provides stretching to the water washable photopolymer printing plate between guiding means (13) and attachments (20) upon being dragged from the vicinity of its downstream edge (91), because of the extended friction between said attachment and said surface; thus the plate (90) can be kept straight without getting deformed or wrinkled throughout the process.

Figure 3:
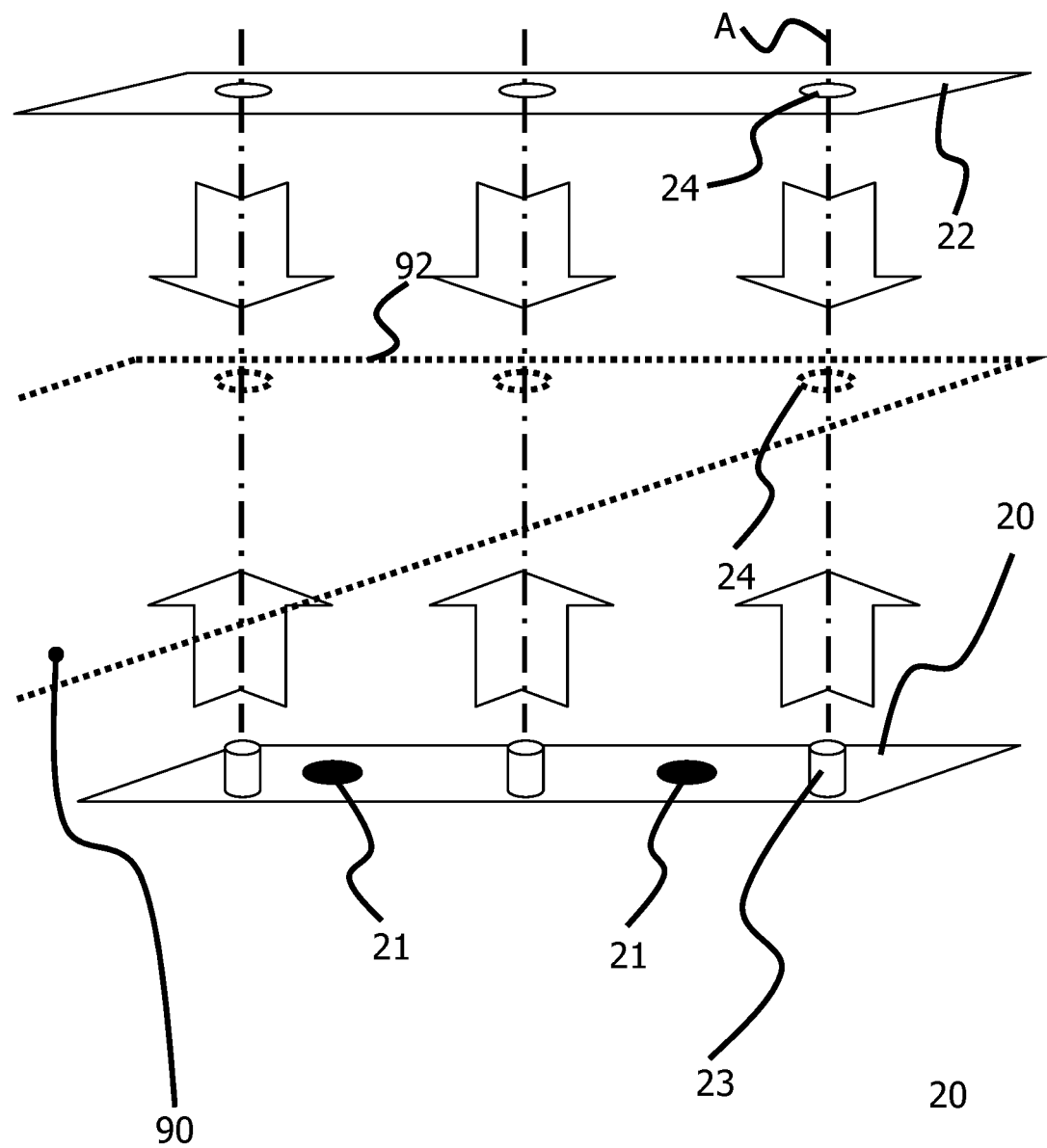
FIG. 3 schematically exemplifies annexing of an embodiment of an attachment to be employed in a system and method according to the present invention, to vicinity of the upstream edge of a water washable photopolymer printing plate.

The attachments (20) used in the method according to the present invention can comprise one or more magnets (21) as exemplified in the FIG. 3 and said surface (12) can comprise ferromagnetic material for being magnetically attracted by said magnets (21), or alternatively, the attachments (20) comprise ferromagnetic material and said surface (12) can comprise one or more magnets (21). Use of these alternatives in the proposed method enables increased friction between the attachment and the surface over magnetic attraction between the ferromagnetic material and the magnets.

The attachments used in the method according to the present invention can comprise one or more sucking discs adapted to provide decreased pressure when applied on said surface. This feature enables that the friction between the attachment and the surface is achieved or increased via decreased gas pressure between the sucking discs and said surface.

The attachments used in the method according to the present invention can comprise an adhesive adapted to provide a reversible adhesion onto said surface, so that friction between the attachment and the surface is thereby further extended.

The attachments used in the method according to the present invention can comprise one or more weights having a density which is greater than that of such water washable photopolymer printing plate; so that the friction between the attachment and said surface is achieved over gravity force applied onto said weights dragging on said surface.

The attachments used in the method according to the present invention can be affixed to such water washable photopolymer printing plate through a plurality of pin-and-hole connection.

Alternatively, the attachments used in the method according to the present invention can be affixed to such water washable photopolymer printing plate through adhesion or through one or more clamps.

Thus, the above-mentioned problems are solved with the system and method according to the present invention.

What is claimed is:

1. A system for processing water washable flexo photopolymer printing plates, the system comprising a washing line including one or more brushes and a surface adjacent the one or more brushes, and a guiding means adapted to guide a water washable flexo photopolymer printing plate through the washing line by pulling the water washable flexo photopolymer printing plate from a vicinity of a downstream edge of the water washable flexo photopolymer printing plate and dragging the water washable flexo photopolymer printing plate on the surface whereby the one or more brushes are adapted to contact onto a side of the water washable flexo photopolymer printing plate in a washing direction (WD) from the downstream edge towards an upstream edge of the water washable flexo photopolymer printing plate, wherein the system further comprises one or more attachments, and wherein the one or more attachments are configured to be magnetically attracted to the surface by one of a first and second techniques: the first technique being that the surface comprises ferromagnetic material while the one or more attachments comprise one or more magnets, the second technique being that the one or more attachments comprise ferromagnetic material while the surface comprises one or more magnets;

the one or more attachments are arranged to be annexed to a vicinity of the upstream edge of the water washable flexo photopolymer printing plate, thereby providing a friction between the one or more attachments and the surface from magnetic attraction between ferromagnetic material and one or more magnets, the friction being greater than the friction between the water washable flexo photopolymer printing plate and the surface as the water washable flexo photopolymer printing plate is dragged on the surface by the guiding means.

2. The system according to claim 1, wherein the one or more attachments comprise a plurality of pins and/or holes so that the one or more attachments are adapted to be affixed to the water washable flexo photopolymer printing plate through a plurality of pin-and-hole connections.

3. The system according to claim 2, further comprising a holding means adapted to cooperate with the one or more attachments in sandwiching of the water washable flexo photopolymer printing plate.

4. The system according to claim 1, wherein the one or more attachments are adapted to be affixed to the water washable flexo photopolymer printing plate through adhesion or through one or more clamps.

5. A method for processing a water washable flexo photopolymer printing plate in a washing line comprising one or more brushes and a surface adjacent the one or more brushes, and a guiding means adapted to guide the water washable flexo photopolymer printing plate through the washing line by pulling the water washable flexo photopolymer from a vicinity of a downstream edge of the water washable flexo photopolymer printing plate and dragging the water washable flexo photopolymer printing plate on the surface whereby a side of the water washable flexo photopolymer printing plate is brought into contact with the one or more brushes in a washing direction (WD) from the downstream edge toward an upstream edge of the water washable flexo photopolymer printing plate, wherein the method comprises selecting one or more attachments such that the one or more attachments provide a friction between the one or more attachments and the surface,
- the friction being greater than the friction between the water washable flexo photopolymer printing plate and the surface as the water washable flexo photopolymer printing plate is dragged on the surface by the guiding means; and
- annexing the one or more attachment to a vicinity of the upstream edge of the water washable flexo photopolymer printing plate, prior to bringing the water washable flexo photopolymer printing plate in contact with the one or more brushes, and
- by the guiding means, dragging the water washable flexo photopolymer printing plate from the vicinity of the downstream edge, along with the one or more attachments; and
- thereby stretching the water washable flexo photopolymer printing plate between the guiding means and the one or more attachments,
- wherein the selection of the one or more attachments is made such that one of the following first and second configurations results: the first configuration being that the one or more attachments comprise one or more magnets while the surface comprises ferromagnetic material, the second configuration being that the one or more attachments comprise ferromagnetic material while the surface comprises one or more magnets.

6. The method according to claim 5, wherein the method comprises affixing the one or more attachments to the water washable flexo photopolymer printing plate with a plurality of pin-and-hole connections.

7. The method according to claim 5, wherein the method comprises an affixing of the one or more attachments to the water washable flexo photopolymer printing plate through adhesion or through one or more clamps.

* * * * *